US012176431B2

(12) United States Patent
Shih et al.

(10) Patent No.: US 12,176,431 B2
(45) Date of Patent: Dec. 24, 2024

(54) ELECTRONIC DEVICE EMPLOYING TWO-DIMENSIONAL ELECTRON GAS WITH REDUCED LEAKAGE CURRENT

(71) Applicant: Taiwan Semiconductor Manufacturing Company, Hsinchu (TW)

(72) Inventors: Tzu-Wen Shih, Hsinchu (TW); Der-Ming Kuo, Hsinchu (TW); Ching-Hua Chiu, Hsinchu (TW); Meng-Shao Hsieh, Taipei (TW); Shih-Hsiang Tai, New Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 406 days.

(21) Appl. No.: 17/742,080

(22) Filed: May 11, 2022

(65) Prior Publication Data

US 2023/0369480 A1 Nov. 16, 2023

(51) Int. Cl.
*H01L 29/778* (2006.01)
*H01L 29/20* (2006.01)
*H01L 29/205* (2006.01)
*H01L 29/40* (2006.01)
*H01L 29/423* (2006.01)
*H01L 29/66* (2006.01)

(52) U.S. Cl.
CPC ...... *H01L 29/7786* (2013.01); *H01L 29/2003* (2013.01); *H01L 29/205* (2013.01); *H01L 29/401* (2013.01); *H01L 29/42316* (2013.01); *H01L 29/66462* (2013.01)

(58) Field of Classification Search
None
See application file for complete search history.

(56) References Cited

U.S. PATENT DOCUMENTS

| | | | |
|---|---|---|---|
| 9,536,962 B1* | 1/2017 | Fan | H01L 29/0891 |
| 2005/0253167 A1* | 11/2005 | Wu | H01L 29/812 |
| | | | 257/E29.317 |
| 2012/0068772 A1* | 3/2012 | Murad | H01L 29/7785 |
| | | | 330/296 |
| 2014/0191240 A1* | 7/2014 | Chiang | H01L 21/2654 |
| | | | 438/285 |
| 2016/0240646 A1* | 8/2016 | Chiu | H01L 29/66431 |
| 2020/0091291 A1* | 3/2020 | Mizan | H01L 23/528 |
| 2020/0343352 A1* | 10/2020 | Trang | H01L 29/7786 |

(Continued)

*Primary Examiner* — Michael Lebentritt
(74) *Attorney, Agent, or Firm* — Lippes Mathias LLP

(57) ABSTRACT

A semiconductor device comprises an insulating region surrounding an active area having a channel direction and a transverse direction that is transverse to the channel direction. A source region and a drain region are disposed in the active area, and are spaced apart along the channel direction. A channel is disposed in the active area and is interposed between the source region and the drain region. The channel comprises a two-dimensional electron gas (2DEG). A gate line is oriented along the transverse direction and is disposed on the channel and has a gate width in the channel direction. The gate line comprises gate material. A gate line terminus is disposed at each end of the gate line. Each gate line terminus comprises the gate material. Each gate line terminus has a width in the channel direction that is at least 1.2 time the gate width.

20 Claims, 4 Drawing Sheets

(56) References Cited

U.S. PATENT DOCUMENTS

| | | | |
|---|---|---|---|
| 2022/0139809 A1* | 5/2022 | Mousavian | H01L 29/8611 257/76 |
| 2022/0376050 A1* | 11/2022 | Chiu | H01L 29/66462 |

* cited by examiner

ELECTRONIC DEVICE EMPLOYING TWO-DIMENSIONAL ELECTRON GAS WITH REDUCED LEAKAGE CURRENT

BACKGROUND

The following relates to semiconductor device arts, semiconductor fabrication arts, two-dimensional electron gas (2DEG) device arts, high electron mobility transistor (HEMT) arts, group III-nitride 2DEG device arts, gallium nitride (GaN)-based 2DEG device arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
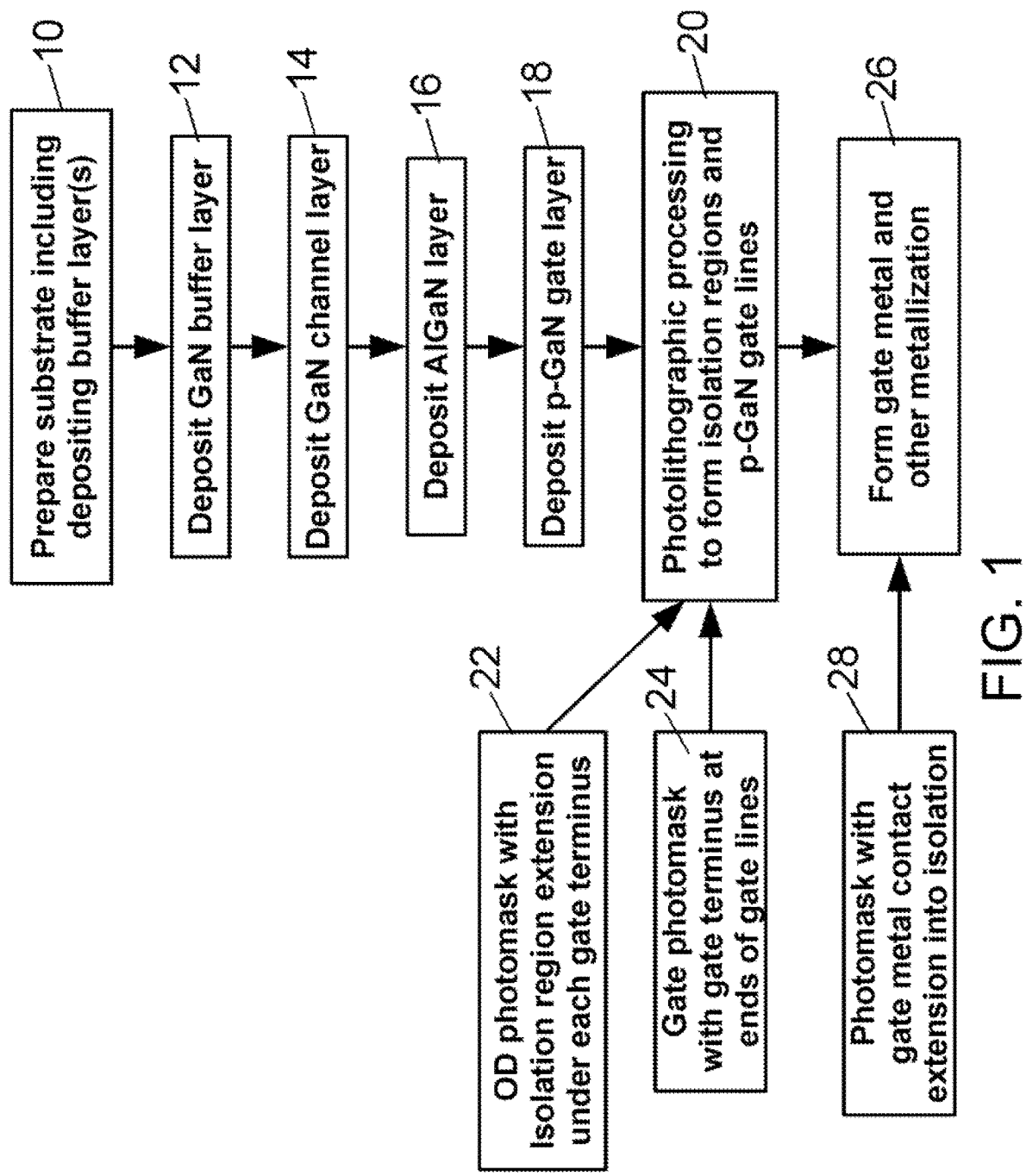
FIG. 1 illustrates a flow chart of a method of making a GaN-based HEMT.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Group III-nitride materials have a large bandgap compared to other semiconductor materials such as group III-arsenide materials. For example, gallium nitride (GaN) has a room temperature bandgap of around 3.4 eV, compared with a bandgap of around 1.42 eV for gallium arsenide (GaAs). The large bandgap makes group III-nitride-based devices well suited for applications calling for high power and/or operating at high temperature. For example, GaN-based devices find application in electronic devices and systems such as fast chargers, mobile switchers, integrated circuit (IC) drivers, on-board chargers (OBC), power for server/data centers, electric vehicles, and so forth, by way of some nonlimiting illustrative examples.

One type of group III-nitride device used in such tasks is the p-GaN high electron mobility transistor (HEMT). In this device, a two-dimensional electron gas (2DEG) is formed at a heterointerface between a ternary aluminum gallium nitride ($Al_xGa_{1-x}N$) layer and a gallium nitride (GaN) layer. The subscript x in $Al_xGa_{1-x}N$ denotes the Al fraction, where x=0 corresponds to GaN and x=1 corresponds to AlN. For notational convenience herein, $Al_xGa_{1-x}N$ is sometimes written without the subscripts as AlGaN. The 2DEG is formed due to the piezoelectric effect, and the AlGaN layer is thin enough to be coherently strained, i.e., the in-plane lattice constant of the thin AlGaN layer is strained to match the in-plane lattice constant of the thicker GaN layer. A p-type GaN layer (p-GaN layer) serves as the gate of the HEMT. While the illustrative embodiments employ a p-GaN gate, in other HEMT designs the gate may be n-type, i.e. an n-type GaN or n-GaN gate.

A problem can arise in such devices, in that the leakage current when the device is off (i.e., in the nonconductive state) can be higher than desired. In other words, the electric current $I_{S,off}$ which is the source-to-drain current in the (nominally) nonconductive state is higher than desired. Disclosed herein are improved electronic devices in which the leakage current is controlled by modifying the gate structure at the edge of the device where it meets the isolation region surrounding the active area. This solution is based on the recognition herein that a source of leakage is electric current flowing around the end of the gate line.

In some embodiments, a semiconductor device includes an insulating region surrounding an active area having a channel direction and a transverse direction that is transverse to the channel direction. A source region and a drain region are disposed in the active area and spaced apart along the channel direction. A channel is disposed in the active area and is interposed between the source region and the channel region. The channel comprising a 2DEG. A gate line oriented along the transverse direction is disposed on the channel, and has a gate width in the channel direction. The gate line comprises gate material (e.g., p-GaN in some illustrative embodiments). A gate line terminus is located at each end of the gate line. Each gate line terminus comprises the gate material, and has a width in the channel direction that is larger than the gate width. This design suppresses the leakage mechanism of electric current flowing around the end of the gate because the enlarged gate line terminus increases the length of that leakage path. Moreover, other design aspects disclosed herein further reduce the leakage.

In the following, some illustrative embodiments are described in terms of a GaN/AlGaN transistor. However, the disclosed embodiments employing an enlarged gate terminus at each end of the gate line are expected to be applicable to other types of group III-nitride electronic devices, and even more generally to other types of transistors or other electronic devices employing a gate line that may benefit from leakage suppression at the gate ends using the gate end terminus structures disclosed herein.

With reference to FIG. 1, a fabrication process for fabricating a GaN HEMT device is depicted by way of a simplified flowchart. The GaN HEMT is formed on a substrate such as a silicon wafer, a silicon carbide (SiC)

wafer, a gallium nitride (GaN) wafer, a silicon-on-insulator (SOI) wafer, or so forth. In an operation 10, the substate is prepared. This may entail various cleaning processes (e.g., wet chemical cleaning, UV-ozone cleaning, or so forth), loading the wafer into a growth chamber, and depositing one or more buffer layers. Some suitable epitaxial deposition techniques include molecular beam epitaxy (MBE) or metal-organic vapor phase epitaxy (MOVPE), the latter epitaxial growth technique also known in the art by other nomenclatures such as metal-organic chemical vapor deposition (MOCVD). Using MOVPE as an example, standard group III precursors such as trimethylgallium (TMGa) or triethylgallium (TEGa) can be used as the Ga source, and trimethylaluminum (TMAl) or triethylaluminum (TEAl) can be used as the Al source. The nitrogen source can be, for example, ammonia or nitrogen. P-type or n-type doping can be obtained using suitable extrinsic dopant precursors or by obtaining intrinsic doping using optimized growth conditions (e.g., temperature, pressure, flow rates). The buffer layer or layers formed in operation 10 are chosen based on the type of substrate. For example, the buffer layer(s) can include an MN buffer layer, AlGaN buffer layer, a strained layer superlattice (SLS), or so forth. This is followed by deposition of a GaN buffer layer in an operation 12. The purpose of the operations 10 and 12 is to provide a high quality and strain-relaxed epitaxial GaN layer surface on which to grow the active layers of the GaN HEMT device. Hence, strain relaxation layers may optionally be employed when fabricating the GaN HEMT on a silicon or SiC substrate having a different lattice constant than GaN. The GaN buffer layer grown in operation 12 may be on the order of a few hundred nanometers to 10 microns thick, although values outside this range are contemplated. It is to be understood that the foregoing are merely provided as non-limiting illustrative examples of some suitable embodiments of operations 10 and 12.

In an operation 14, a GaN channel layer is formed on the substrate prepared by the operations 10 and 12 using MOVPE or another suitable epitaxial growth technique. The GaN channel layer is typically grown to a thickness of a few nanometers to a few hundred nanometers, e.g. having thickness of between 10 nm and 200 nm in some nonlimiting illustrative embodiments, although other thickness values are contemplated. The GaN channel layer may be not-intentionally-doped (i.e., no dopant gas is flowed during deposition, sometimes referred to as "undoped" in the art), or may be doped p-type or n-type depending on the design of the GaN HEMT. In an operation 16, an aluminum gallium nitride ($Al_xGa_{1-x}N$) layer is formed on the GaN channel deposited in previous operation 14. The $Al_xGa_{1-x}N$ layer is sufficiently thin to be coherently strained, that is, for the in-plane lattice constant of the $Al_xGa_{1-x}N$ layer to be strained to match the in-plane lattice constant of the thicker GaN buffer layer. For example, the $Al_xGa_{1-x}N$ layer may be between 2 nm and 40 nm thick in some nonlimiting illustrative embodiments. The aluminum composition (denoted by x in $Al_xGa_{1-x}N$) may in general be in the range 0.08 to 0.92, depending on the design of the GaN HEMT. As is known in the art, the piezoelectric effect operating on the coherent strain leads to a two-dimensional electron gas (2DEG) being present at the heterointerface between the GaN channel and the AlGaN formed in the respective operations 14 and 16. It is this 2DEG which provides the electrically conductive channel of the transistor.

In an operation 18, a p-GaN layer is formed on the AlGaN layer formed in operation 16. The p-GaN layer will subsequently be photolithographically etched to define a p-GaN gate line for each GaN transistor. (It will be appreciated that while this description may refer to a single GaN transistor for convenience, typically a large number of GaN transistors are fabricated on a single wafer). The p-GaN layer may, by way of non-limiting illustration, be grown to a thickness of 10-200 nm, although values outside this illustrative range are contemplated. The p-GaN layer may be doped p-type at a concentration of at least $5\times10^{17}$ $cm^{-3}$, and in some non-limiting illustrative embodiments in a range of $10^{18}$-$10^{23}$ $cm^{-3}$, although a doping value outside of these ranges is contemplated. Typically the p-type doping is achieved by flowing a suitable dopant precursor gas during the MOVPE growth operation 18. While in the illustrative examples a p-GaN gate is used, in other embodiments an n-type GaN (n-GaN) gate may be employed, e.g. with a comparable n-type doping concentration of at least $5\times10^{17}$ $cm^{-3}$, and in some nonlimiting illustrative embodiments an n-GaN gate with n-type doping in a range of $10^{18}$-$10^{23}$ $cm^{-3}$.

The operations 10, 12, 14, 16, and 18 are typically carried out in an MBE ultrahigh vacuum (UHV) chamber, an MOVPE reactor chamber, or other epitaxial growth chamber configured to epitaxially deposit or grow group III-nitride material such as GaN and AlGaN. After the epitaxial growth, the wafer is removed from the epitaxial growth chamber and processed lithographically to define the GaN transistor or (more typically) transistors on the wafer. In an operation 20, photolithographic processing is performed to form isolation regions and to perform patterned etching of the p-GaN layer formed in the operation 18 to define the p-GaN gate line of each GaN transistor. The isolation region surrounds the active area of each GaN transistor. The isolation regions may, for example, be formed using ion implantation to disrupt the coherent strain of the AlGaN layer in the isolation region and thus remove the 2DEG in the isolation region. A photolithographic mask 24, referred to herein as the GaN gate line mask 24, is used to define the GaN gate lines of the transistors fabricated on the wafer. A photolithographic mask 22, sometimes referred to as an OD mask 22, is used to define the isolation region. In one typical workflow, the GaN gate line mask 24 is applied first to define the GaN gate lines, followed by application of the OD mask 22 to define the isolation region. The etching of the p-GaN layer to define the p-GaN gate lines may, for example, use wet and/or dry etching with an etchant having high selectivity for etching the p-GaN over the AlGaN, thus using the AlGaN as an etch stop layer for this etching step. It will be appreciated that the foregoing is a high level description, and that the processing to form the isolation region and the p-GaN gate lines may optionally involve additional sub-steps depending on the processing workflow, such as depositing one or more mask dielectric layers before the photoresist and etching the mask dielectric layer(s) as part of the isolation region and/or p-GaN gate line definition processing, and/or different ordering of the steps. Furthermore, the processing 20 includes formation of source and drain regions in the active area of each GaN transistor. This may, for example, entail suitable dopant implantation or the like. In an operation 26, metal deposition is performed to deposit gate metal on the p-GaN gate lines, as well as to deposit source and drain metal and optional gate field plates. The metal deposition operation 26 employs a photomask 28 for delineating the metal. It will be appreciated that the processing to form the metal areas may optionally involve additional sub-steps depending on the processing workflow, such as depositing dielectric material in areas not covered by the metal.

As previously mentioned, improved electronic devices disclosed herein have leakage current at around the ends of the gate line that is controlled by modifying the gate line at the edge of the device where it meets the isolation region surrounding the active area. To this end, a gate line terminus is located at each end of the gate line. Each gate line terminus is made of the same material as the gate, and is wider than the gate. To implement this feature, the gate mask 24 is modified to form the gate line terminus at each end of the gate line. As further disclosed herein, the OD mask 22 is modified to adjust the isolation under the gate line terminus, and the gate metal mask 28 is modified to adjust the gate metal extension into the isolation region. These features will be described in further detail in the following, in terms of the resulting device structure.

Figure 2:
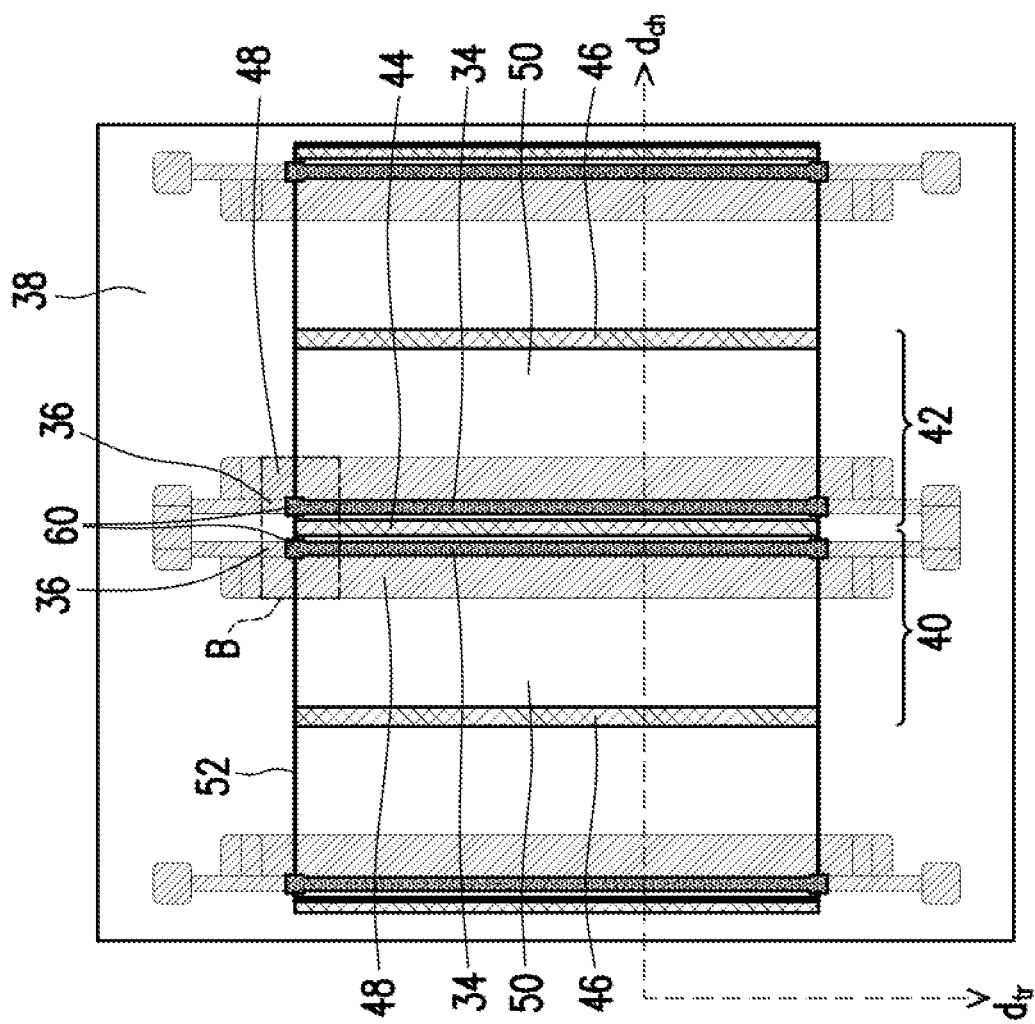
FIG. 2 diagrammatically illustrates a top view of a GaN-based high electron mobility transistor (HEMT).
Figure 3:
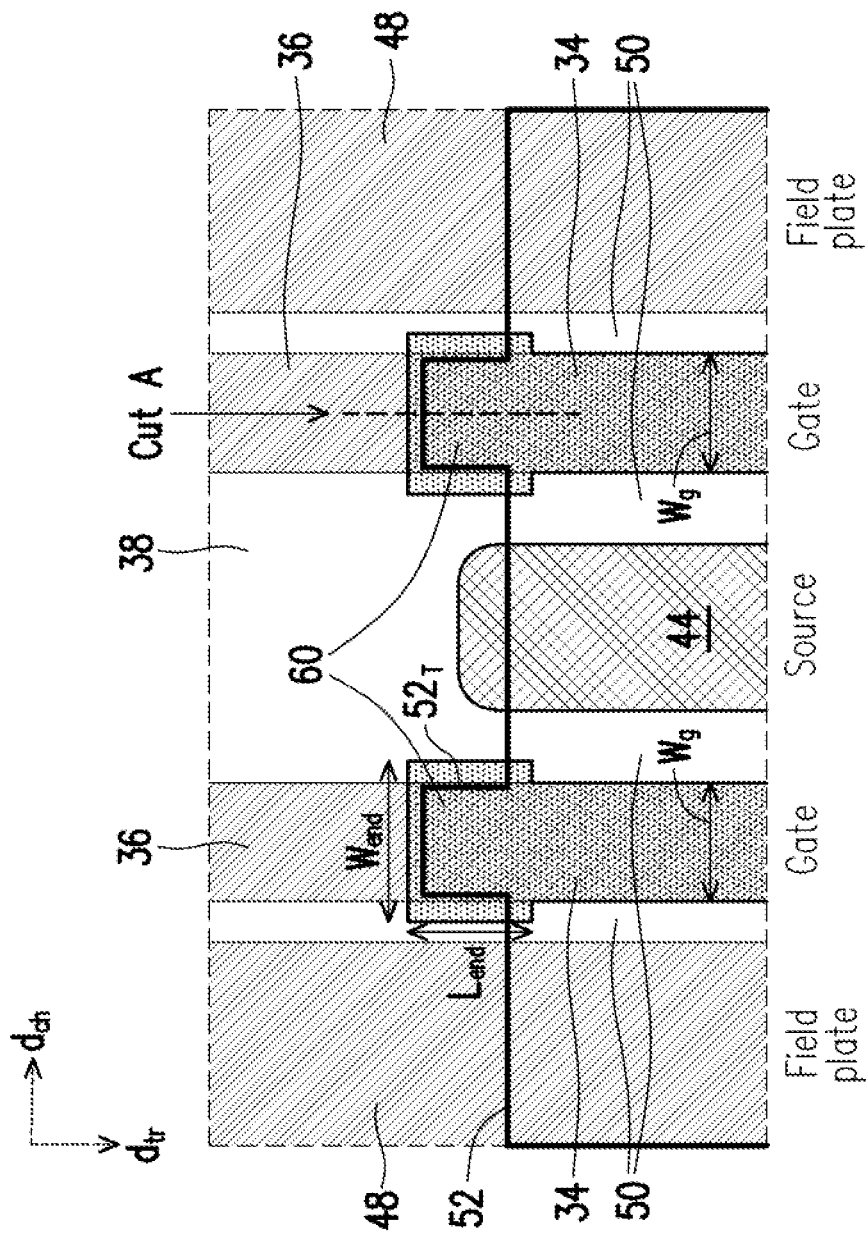
FIG. 3 diagrammatically illustrates an enlarged top view of a region of the GaN-based HEMT of FIG. 2 indicated by a box in FIG. 2.
Figure 4:
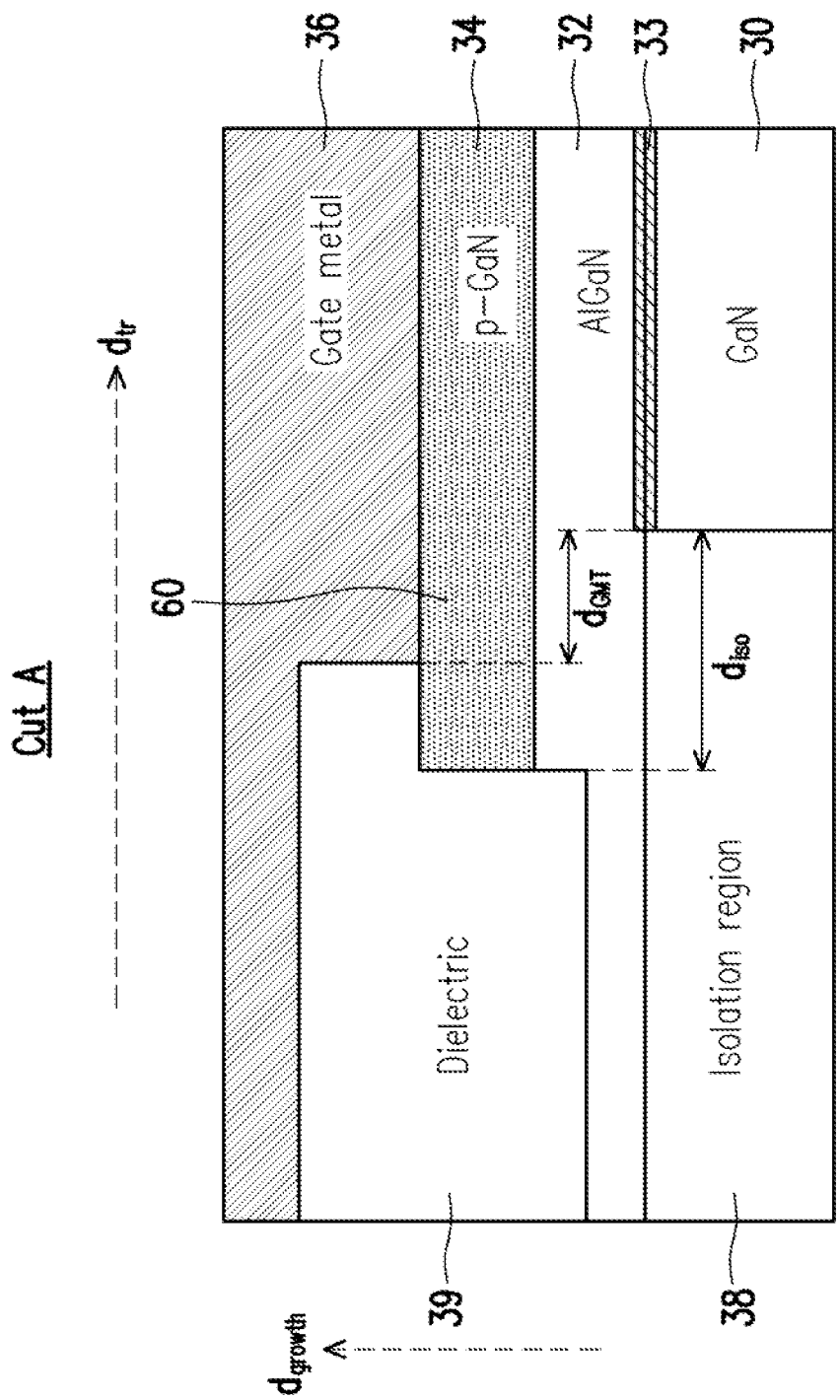
FIG. 4 diagrammatically illustrates a sectional view along Cut A indicated in FIG. 3.

With reference to FIGS. 2-4, an illustrative GaN-based HEMT device is shown. FIG. 2 diagrammatically illustrates a top view of the GaN-based HEMT. FIG. 3 diagrammatically illustrates an enlarged top view of a region of the GaN-based HEMT of FIG. 2 indicated by a box B in FIG. 2. FIG. 4 diagrammatically illustrates a sectional view along Cut A indicated in FIG. 3. Starting with the sectional view of FIG. 4, the direction of epitaxial growth performed in the operations 10, 12, 14, 16, and 18 of FIG. 1 is indicated in FIG. 1 as a growth direction $d_{growth}$. It is seen in FIG. 4 that the GaN-based HEMT includes a GaN channel layer 30, AlGaN 32 disposed on the GaN channel layer 30, a p-GaN (i.e., p-type GaN) gate 34 disposed on the AlGaN 32, and gate metal 36 disposed on the p-GaN gate 34. A two-dimensional electron gas (2DEG) 33 is formed at the heterointerface between the GaN channel layer 30 and the AlGaN 32. As is understood in the art, the 2DEG 33 comprises an electron gas that is relatively free to move in the plane of the 2DEG (that is, in the plane of the 2DEG transverse to the growth direction $d_{growth}$) but is tightly confined in the direction transverse to this plane (that is, the electron gas is tightly confined in the growth direction $d_{growth}$). In the illustrative embodiment, the 2DEG is formed at the heterointerface between the GaN and the $Al_xGa_{1-x}N$ layers by the piezoelectric effect introduced by stress on the coherently strained AlGaN 32.

Referring back to the flowchart of FIG. 1, the GaN channel layer 30 may be formed by the GaN channel deposition operation 14 and the patterning operation 20 which forms an isolation region 38 surrounding the GaN transistor device. The AlGaN 32 may be formed by the AlGaN deposition operation 16 and the patterning operation 20. In some embodiments, the AlGaN 32 comprises $Al_xGa_{1-x}N$ having an aluminum fraction x in a range of 0.08 to 0.92, and may be between 2 nm and 40 nm thick in some nonlimiting illustrative embodiments. The p-GaN gate 34 may be formed by the p-GaN gate layer deposition 18 and the p-GaN gate definition portion of the operation 20. In some embodiments, the p-GaN gate 34 is doped p-type at a concentration of at least $5\times10^{17}$ cm$^{-3}$, and in some nonlimiting illustrative embodiments in a range of $10^{18}$-$10^{23}$ cm$^{-3}$. The p-GaN gate 34 may have a thickness of between 10 nm and 200 nm in some nonlimiting illustrative embodiments. The gate metal 36 may be formed in the operation 26 of FIG. 1. The gate metal 36 may, for example, comprise titanium (Ti), titanium nitride (TiN), aluminum (Al), an aluminum-copper alloy (AlCu), platinum (Pt), silver (Ag), palladium (Pd), copper (Cu), gold (Au), nickel (Ni), a gold-germanium alloy (AuGe), a gold-beryllium alloy (AuBe), or so forth. Furthermore, a field dielectric 39 is disposed on the isolation region 38, a multilayer stack of two or more such materials, or so forth. The dielectric 39 may for example comprise silicon nitride, silicon oxide, a metal oxide, a high-k dielectric film, a multilayer stack of two or more such materials, or so forth. The sectional view of FIG. 4 omits any layers underlying the GaN channel layer 30, such as any buffer layers, as well as the substrate.

Turning to the top view of FIG. 2, the illustrative GaN-based HEMT device includes a first transistor 40 and a second transistor 42 which in this specific example share a common source line 44, though this arrangement is to be understood as merely a nonlimiting illustrative example. Each transistor further includes a drain line 46. The top view of FIG. 2 also illustrates the gate metal 36 deposited on the p-GaN gate 34. Note, the gate metal 36 is shown in FIGS. 2 and 3 using hatching to enable depiction of the underlying p-GaN gate line 34. Each illustrative transistor 40 and 42 also includes a gate field plate 48 that is proximate to the gate metal 36. The optional field plate 48 reduces the maximum surface electric field at the gate edge, thus improving performance of the GaN-based transistor. Also indicated in FIG. 2 is the channel 50, which is disposed in an active area 52 of the transistor. The active area 52 is diagrammatically indicated by a bold line in FIGS. 2 and 3, and is understood to be surrounded by the dielectric 39 (see FIG. 4). The channel 50 is interposed between the source line or region 44 and the drain line or region 46, and the p-GaN gate 34 is disposed on the channel 50 and interposed between the source 44 and the drain 46. The channel 50 comprises the two-dimensional electron gas (2DEG) formed at the heterointerface between the GaN layer 30 and the AlGaN 32. In the illustrative example, the electrons of the 2DEG are relatively free to move in a plane that is parallel with both the channel direction $d_{ch}$ and transverse direction $d_{tr}$, but the electrons are tightly confined in the growth direction $d_{growth}$ (see FIG. 4) which is perpendicular to both the channel direction $d_{ch}$ and to the transverse direction $d_{tr}$.

As further seen in FIG. 2, the illustrative GaN-based HEMT device is part of a linear array of GaN-based transistors, which is a common GaN HEMT array topology. Again, this arrangement is to be understood as merely a nonlimiting illustrative example.

The isolation region 38 of FIG. 4 surrounds the active area 52 of the GaN-based HEMT device. As indicated in FIGS. 2-4, the active area 52 (or, alternatively, the GaN-based HEMT) has a channel direction $d_{ch}$ and a transverse direction $d_{tr}$ that is transverse to the channel direction. As seen in FIG. 2, the source region 44 and the drain region 46 are disposed in the active area 52 and are spaced apart along the channel direction $d_{ch}$. The channel 50 is disposed in the active area 52 and is interposed between the source region 44 and the drain region 46. The gate line 34 is oriented along the transverse direction $d_{tr}$ and is disposed on the channel 50. As indicated in FIG. 3, the gate 34 has a gate width $W_g$ in the channel direction $d_{ch}$.

A typical conventional GaN-based HEMT device has the p-GaN gate line of constant width along its entire length, and the p-GaN gate line extends from one end of the active area to the other along the transverse direction. It has been found in tests reported herein that in such a conventional device, a potential electric current leakage path is around the ends of the gate line. This is observed as high chip probe (CP) $I_{S,off}$ current values (where $I_{S,off}$ is the current flowing when the transistor is in the nominally off state). Failure analysis using emission microscopy (EMMI) has identified $I_{S,off}$ leakage hot spots near the ends of the P-GaN gate line, namely at the junction between the end of the gate line and the isolation region. Current-voltage (I-V) measurements also showed leak from drain to source indicating early punch. These effects could suppress the gate voltage by Vg=−2V. Thus, it was concluded that there was as current leakage path in the 2DEG channel, namely a leak path around gate within isolation area from drain to source.

In embodiments disclosed herein, this leakage around the ends of the gate line is suppressed by modification of the ends of the p-GaN gate line 34 and associated structure. The p-GaN gate line at each end is enlarged to lengthen the electric current leakage path around the end of the gate line.

With particular reference now to FIG. 3 which diagrammatically depicts the enlarged view of the box B indicated in FIG. 2, an illustrative embodiment of a modified end of the p-GaN gate line 34 and associated structure is diagrammatically shown. The enlarged portion of the gate line 34 at each end of the gate line is referred to herein as a gate line terminus 60. While FIG. 3 shows an enlarged view of the box B indicated in FIG. 2 and thus shows one end two gate lines 34, it will be appreciated that a similar gate line terminus 60 is present at the opposite end of each of the two gate lines 34. Each gate line terminus 60 comprises the gate material, e.g. each gate line terminus 60 comprises p-GaN in the case of the illustrative p-GaN gate line 34. In practice, the gate line terminus 60 is a continuation of the gate line 34, and is formed integrally and at the same time as the gate line 34. For example, with reference back to FIG. 1 the illustrative p-GaN gate line 34 is suitably formed by patterned etching during operation 20 of the p-GaN gate layer formed in the p-GaN gate layer deposition 18. The p-GaN gate line terminus 60 at each end of the gate line 34 is integrally and simultaneously formed by the patterned etching during operation 20 of the p-GaN gate layer formed in the p-GaN gate layer deposition 18. To do so, the gate photomask 24 is suitably modified to define the p-GaN gate line terminus 60 at each end of the p-GaN gate line 34 along with the p-GaN gate line 34 itself. Thus, the p-GaN terminus 60 has the same characteristics as the p-GaN gate line 34, e.g. the p-GaN terminus 60 is suitably doped p-type at a concentration of at least $5 \times 10^{17}$ cm$^{-3}$, and in some nonlimiting illustrative embodiments in a range of $10^{18}$-$10^{23}$ cm$^{-3}$, and may have a thickness of between 10 nm and 200 nm in some nonlimiting illustrative embodiments.

As seen in FIG. 3, the p-GaN terminus 60 has a larger width $W_{end}$ in the channel direction $d_{ch}$ compared with the gate width $W_g$ of the p-GaN gate line 34. In some nonlimiting illustrative embodiments, each gate terminus 60 has a width $W_{end}$ in the channel direction $d_{ch}$ that is at least 1.2 time the gate width $W_g$, i.e. $W_{end} \geq 1.2 W_g$. The illustrative p-GaN terminus 60 has a length $L_{end}$ along the transverse direction $d_{tr}$ that is at least as long as the gate width $W_g$, i.e. $L_{end} \geq W_g$.

Moreover, as seen in FIG. 3, the illustrative active area 52 is rectangular, with an active area extension $52_T$ extending outward and underlying a central portion of each gate line terminus 60. Said another way, the ion implantation isolation region 38 is reduced to form the active area extensions $52_T$. A peripheral portion of each gate line terminus 60 is disposed outside of the active area 52 (and more particularly outside of the active area extension $52_T$), on the insulating region 38. As further seen in FIG. 3, for the illustrative active area extension $52_T$, the peripheral portion of each gate line terminus 60 that is disposed on the insulating region 38 includes three sides of the gate line terminus 60 which are at least partly disposed on the insulating region 38. (Note, the dielectric 39 shown in FIG. 4 is not depicted in FIGS. 2 and 3). With reference to FIG. 4, the gate line terminus 60 extends a distance $d_{iso}$ onto the insulating region 38. In some embodiments, $d_{iso} \geq 0.8$ micron, i.e. each gate line terminus 60 extends at least 0.8 micron onto the insulating region 38 in the transverse direction.

With continuing reference to FIG. 4, the gate metal 36 comprising one or more metal layers is disposed on the gate line 34 and further forms a gate metal terminus corresponding to each gate line terminus 60. The gate metal terminus comprises an extension of the gate metal 34 onto the corresponding gate line terminus 60. Each such gate metal terminus contacts the gate line terminus 60 over a distance $d_{GMT}$ that extends at least 0.5 micron into the insulating region 38 in the transverse direction $d_{tr}$, as seen in FIG. 4. The gate metal 36 then continues over the insulating region 38 disposed on the field dielectric 39, as also seen in FIGS. 2 and 3.

In operation, the gate line terminus 60 and ancillary features including the reduction in the isolation region 38 to form the active area extensions $52_T$ and the gate metal extension ($d_{GMT}$) into the isolation area 38 cooperatively increase the path length of any electrical leakage current going around the end of the gate line 34. This, in turn, is expected to reduce the leakage current of the GaN HEMT overall, and thereby avoid the suppression of the gate voltage.

While the illustrative GaN-based HEMT shown in FIGS. 2-4 is presented as an example, it will be appreciated that the disclosed approach for reducing leakage current is amenable to numerous variants. Some non-exhaustive variants are described in the following.

While the illustrative gate line terminus 60 is rectangular in shape, alternative geometries are contemplated, e.g. circular, oval-shaped, hexagonal, or otherwise-shaped gate line terminus. Similar geometrical variation is contemplated for the underlying active area extension $52_T$.

While the illustrative device is a GaN-based HEMT, the approach is amenable for use in other types of devices. For example, in a more generalized embodiment, the channel 50 may comprise a first layer of a first group III-nitride material (GaN 30 in the illustrative example, but other materials are contemplated such as a low aluminum concentration $Al_\Delta G_{1-\Delta}N$ where $\Delta$ is under 0.05), and a second layer of a second group III-nitride material having a different relaxed lattice constant than the first group III-nitride material (AlGaN 32 in the illustrative embodiment, but other materials are contemplated such as a material including indium), where the 2DEG 33 is formed at the heterointerface between the first layer and the second layer. As another example, the device could be a GaAs-based HEMT, for example substituting GaAs for the GaN channel 30 and $Al_xGa_{1-x}As$ for the $Al_xGa_{1-x}N$ 32 in the structure of FIG. 4. As another example, the device could be a SiGe-based HEMT, for example substituting Si for the GaN channel 30 and $Si_{1-x}Ge_x$ for the $Al_xGa_{1-x}N$ 32 in the structure of FIG. 4.

Even more generally, it is contemplated to employ the disclosed approach for reducing leakage current to devices that do not employ a 2DEG. For example, a device employing a two-dimensional hole gas (2DHG) in place of the 2DEG 33 is contemplated. As another example, the approach could be employed in a transistor formed in an active area surrounded by an insulating region, transistor including a source region, a drain region, a channel interposed between the source region and the drain region, and a gate line disposed on the channel and interposed between the source region and the gate region. The disclosed gate line terminus is disposed at each end of the gate line, with each gate line terminus being an extension of the gate line and each gate line terminus having a width that is at least 1.2 time the gate width. In some such embodiments, a central portion of each gate line terminus is disposed on the active area and a peripheral portion of each gate line terminus is disposed on the insulating region (for example, using the active area extensions $52_T$ as disclosed herein).

In the following, some further embodiments are described.

In a nonlimiting illustrative embodiment, a semiconductor device comprises: an insulating region surrounding an active area having a channel direction and a transverse direction that is transverse to the channel direction; a source region and a drain region disposed in the active area and spaced apart along the channel direction; a channel disposed in the active area and interposed between the source region and the drain region, the channel comprising a 2DEG; a gate line oriented along the transverse direction and disposed on the channel and having a gate width in the channel direction, the gate line comprising gate material; and a gate line terminus at each end of the gate line. Each gate line terminus comprises the gate material. In some embodiments, each gate line terminus has a width in the channel direction that is at least 1.2 time the gate width.

In a nonlimiting illustrative embodiment, a semiconductor device comprises an insulating region surrounding a rectangular active area having a channel direction and a transverse direction that is transverse to the channel direction. The rectangular active area has active area extensions extending outward into the insulating region. A source region and a drain region are disposed in the active area and are spaced apart along the channel direction. A channel is disposed in the active area and is interposed between the source region and the drain region. The channel comprises a gallium nitride (GaN) layer and an aluminum gallium nitride ($Al_xGa_{1-x}N$) layer disposed on the GaN layer having an aluminum fraction x in a range of 0.08 to 0.92. The channel further comprises a 2DEG formed between the GaN layer and the $Al_xGa_{1-x}N$ layer. A gate line is oriented along the transverse direction and is disposed on the channel and has a gate width in the channel direction. The gate line comprises a gallium nitride (GaN) material having a p-type or n-type doping concentration of at least $5 \times 10^{17}$ $cm^{-3}$. A gate line terminus is disposed at each end of the gate line. Each gate line terminus comprises the GaN material, and in some embodiments each gate line terminus has a width in the channel direction that is at least 1.2 times the gate width. In some embodiments, each gate line terminus has a central portion disposed on a corresponding active area extension and a peripheral portion disposed on the insulating region.

In a nonlimiting illustrative embodiment, a semiconductor device comprises: an insulating region surrounding a rectangular active area having a channel direction and a transverse direction that is transverse to the channel direction, the rectangular active area having active area extensions extending outward into the insulating region; a source region and a drain region disposed in the active area and spaced apart along the channel direction; a channel disposed in the active area and interposed between the source region and the drain region, the channel comprising a two-dimensional electron gas (2DEG); a gate line oriented along the transverse direction and disposed on the channel and having a gate width in the channel direction; and a gate line terminus at each end of the gate line, each gate line terminus comprising a same material as the gate line and each gate line terminus extending at least 0.8 micron onto the insulating region in the transverse direction, each gate line terminus having a central portion disposed on a corresponding active area extension and a peripheral portion disposed on the insulating region.

In a nonlimiting illustrative embodiment, a semiconductor device comprises: a transistor formed in an active area surrounded by an insulating region, the transistor including a source region, a drain region, a channel interposed between the source region and the drain region, and a gate line disposed on the channel and interposed between the source region and the gate region; and a gate line terminus at each end of the gate line, each gate line terminus being an extension of the gate line and each gate line terminus having a width that is at least 1.2 time the gate width. A central portion of each gate line terminus is disposed on the active area and a peripheral portion of each gate line terminus is disposed on the insulating region The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    an insulating region surrounding an active area having a channel direction and a transverse direction that is transverse to the channel direction;
    a source region and a drain region disposed in the active area and spaced apart along the channel direction;
    a channel disposed in the active area and interposed between the source region and the drain region, the channel comprising a two-dimensional electron gas (2DEG);
    a gate line oriented along the transverse direction and disposed on the channel and having a gate width in the channel direction, the gate line comprising gate material; and
    a gate line terminus at each end of the gate line, each gate line terminus comprising the gate material and each gate line terminus having a width in the channel direction that is at least 1.2 time the gate width.

2. The semiconductor device of claim 1 wherein each gate line terminus has a length along the transverse direction that is larger than the gate width.

3. The semiconductor device of claim 1 wherein a central portion of each gate line terminus is disposed on the active area and a peripheral portion of each gate line terminus is disposed on the insulating region.

4. The semiconductor device of claim 3 wherein the peripheral portion of each gate line terminus disposed on the insulating region includes three sides of the gate line terminus which are at least partly disposed on the insulating region.

5. The semiconductor device of claim 3 wherein each gate line terminus extends at least 0.8 micron onto the insulating region in the transverse direction.

6. The semiconductor device of claim 3 further comprising:
    a gate metal comprising one or more metal layers disposed on the gate line; and
    a gate metal terminus corresponding to each gate line terminus that comprises an extension of the gate metal onto the corresponding gate line terminus;

wherein each gate metal terminus contacts the gate line terminus over a distance that extends at least 0.5 micron into the insulating region in the transverse direction.

7. The semiconductor device of claim 1 wherein the channel comprises:
   a first layer of a first group III-nitride material; and
   a second layer of a second group III-nitride material having a different relaxed lattice constant than the first group III-nitride material;
   wherein the 2DEG is formed at a heterointerface between the first layer and the second layer.

8. The semiconductor device of claim 1 wherein:
   the channel comprises a gallium nitride (GaN) layer and an aluminum gallium nitride ($Al_xGa_{1-x}N$) layer disposed on the GaN layer and having an aluminum fraction x in a range of 0.08 to 0.92 wherein the 2DEG is formed between the GaN layer and the $Al_xGa_{1-x}N$ layer; and
   the gate line comprises gallium nitride (p-GaN) having a p-type or n-type doping concentration of at least $5 \times 10^{17}$ $cm^{-3}$.

9. The semiconductor device of claim 8 wherein the $Al_xGa_{1-x}N$ layer has a thickness of between 2 nanometers and 40 nanometers.

10. The semiconductor device of claim 8 wherein the p-GaN has a thickness of between 10 nm and 200 nm.

11. The semiconductor device of claim 8 wherein the insulating region comprises an ion-implanted region.

12. A semiconductor device comprising:
   an insulating region surrounding a rectangular active area having a channel direction and a transverse direction that is transverse to the channel direction, the rectangular active area having active area extensions extending outward into the insulating region;
   a source region and a drain region disposed in the active area and spaced apart along the channel direction;
   a channel disposed in the active area and interposed between the source region and the drain region, the channel comprising a two-dimensional electron gas (2DEG);
   a gate line oriented along the transverse direction and disposed on the channel and having a gate width in the channel direction; and
   a gate line terminus at each end of the gate line, each gate line terminus comprising a same material as the gate line and each gate line terminus extending at least 0.8 micron onto the insulating region in the transverse direction, each gate line terminus having a central portion disposed on a corresponding active area extension and a peripheral portion disposed on the insulating region.

13. The semiconductor device of claim 12 wherein each gate line terminus has a length along the transverse direction that is larger than the gate width.

14. The semiconductor device of claim 12 wherein the peripheral portion of each gate line terminus disposed on the insulating region includes three sides of the gate line terminus which are at least partly disposed on the insulating region.

15. The semiconductor device of claim 12 wherein each gate line terminus has a width in the channel direction that is at least 1.2 times the gate width.

16. The semiconductor device of claim 12 further comprising:
   a gate metal comprising one or more metal layers disposed on the gate line; and
   a gate metal terminus corresponding to each gate line terminus that comprises an extension of the gate metal onto the corresponding gate line terminus;
   wherein each gate metal terminus contacts the gate line terminus over a distance that extends at least 0.5 micron onto the insulating region in the transverse direction.

17. The semiconductor device of claim 12 wherein the channel comprises a gallium nitride (GaN) layer and an aluminum gallium nitride ($Al_xGa_{1-x}N$) layer disposed on the GaN layer having an aluminum fraction x in a range of 0.08 to 0.92, the channel further comprising the 2DEG formed between the GaN layer and the $Al_xGa_{1-x}N$ layer, and the gate line comprising a GaN material having a p-type or n-type doping concentration of at least $5 \times 10^{17}$ $cm^{-3}$.

18. A semiconductor device comprising:
   a transistor formed in an active area surrounded by an insulating region, the transistor including a source region, a drain region, a channel interposed between the source region and the drain region, and a gate line disposed on the channel and interposed between the source region and the gate region; and
   a gate line terminus at each end of the gate line, each gate line terminus being an extension of the gate line and each gate line terminus having a width that is at least 1.2 time a width of the gate line;
   wherein a central portion of each gate line terminus is disposed on the active area and a peripheral portion of each gate line terminus is disposed on the insulating region.

19. The semiconductor device of claim 18 wherein the peripheral portion of each gate line terminus extends at least 0.8 micron onto the insulating region.

20. The semiconductor device of claim 19 wherein the transistor further includes a gate metal comprising one or more metal layers disposed on the gate line, and the semiconductor device further comprises:
   a gate metal terminus corresponding to each gate line terminus that comprises an extension of the gate metal onto the corresponding gate line terminus;
   wherein each gate metal terminus contacts the gate line terminus over a distance that extends at least 0.5 micron onto the insulating region in the transverse direction.

* * * * *